United States Patent
Dusija et al.

(10) Patent No.: US 9,589,645 B2
(45) Date of Patent: Mar. 7, 2017

(54) BLOCK REFRESH TO ADAPT TO NEW DIE TRIM SETTINGS

(71) Applicant: SanDisk Technologies Inc., Plano, TX (US)

(72) Inventors: Gautam Dusija, Milpitas, CA (US); Chris Avila, Milpitas, CA (US); Jonathan Hsu, Newark, CA (US); Neil Darragh, Milpitas, CA (US); Bo Lei, San Ramon, CA (US)

(73) Assignee: SanDisk Technologies LLC, Plano, TX (US)

( * ) Notice: Subject to any disclaimer, the term of this patent is extended or adjusted under 35 U.S.C. 154(b) by 165 days.

(21) Appl. No.: 14/507,245

(22) Filed: Oct. 6, 2014

(65) Prior Publication Data

US 2016/0099057 A1    Apr. 7, 2016

(51) Int. Cl.
| | | |
|---|---|---|
| G11C 16/10 | (2006.01) | |
| G11C 16/34 | (2006.01) | |
| G11C 29/02 | (2006.01) | |
| G11C 16/04 | (2006.01) | |

(52) U.S. Cl.
CPC .......... G11C 16/10 (2013.01); G11C 16/3459 (2013.01); G11C 29/028 (2013.01); G11C 16/0483 (2013.01)

(58) Field of Classification Search
CPC ... G11C 16/10; G11C 29/028; G11C 16/3459; G11C 16/0483
See application file for complete search history.

(56) References Cited

U.S. PATENT DOCUMENTS

| | | | |
|---|---|---|---|
| 7,961,517 B2 | 6/2011 | Aritome | |
| 8,223,574 B2 | 7/2012 | Nautiyal et al. | |
| 8,472,280 B2 | 6/2013 | Li | |
| 2006/0221681 A1* | 10/2006 | Misumi | G11C 16/30 365/185.01 |
| 2007/0223278 A1* | 9/2007 | Aritome | G11C 16/10 365/185.11 |
| 2009/0010066 A1* | 1/2009 | Kim | G11C 16/10 365/185.18 |
| 2009/0109756 A1 | 4/2009 | Aritome | |
| 2009/0285024 A1* | 11/2009 | Kang | G11C 11/5628 365/185.03 |
| 2010/0014363 A1* | 1/2010 | Wang | G11C 7/08 365/189.15 |
| 2011/0153913 A1* | 6/2011 | Huang | G11C 7/1042 711/103 |
| 2011/0186919 A1* | 8/2011 | Van Noort | G11C 16/0416 257/298 |
| 2012/0007652 A1* | 1/2012 | Li | H03M 1/1014 327/362 |
| 2014/0006688 A1 | 1/2014 | Yu et al. | |
| 2016/0098216 A1 | 4/2016 | Huang et al. | |

FOREIGN PATENT DOCUMENTS

WO    WO 2013/100958 A1    7/2013

* cited by examiner

*Primary Examiner* — Khamdan Alrobaie
(74) *Attorney, Agent, or Firm* — Brinks Gilson & Lione

(57) ABSTRACT

Systems, apparatuses, and methods may be provided that adapt to trim set advancement. Trim set advancement may be a change in trim sets over time. A cell of a semiconductor memory may have a first charge level and be programmed with a first trim set. The cell may be reprogrammed by raising the first charge level to a second charge level that corresponds to the cell programmed with a second trim set.

21 Claims, 3 Drawing Sheets

100 System

BLOCK REFRESH TO ADAPT TO NEW DIE TRIM SETTINGS

BACKGROUND

1. Technical Field

This application relates to semiconductor memory and, in particular, to trim settings.

2. Related Art

A trim set may include one or more trim settings, such as a program voltage, a step-up voltage, and/or a program pulse width. Each trim set may be associated with a corresponding portion of semiconductor memory. Each portion of memory may be a page, a block, a column, or any other suitable division of the semiconductor memory. When the portion of the memory is programmed as part of a write operation, the trim settings, such as the program voltage, of the corresponding trim set may be used to program the portion of the semiconductor memory.

The trim settings may include one or more parameters related to read operations. For example, the trim settings may include a sensing time or sense amplifier delay, and/or a sensing or sense reference voltage. The parameters related to read operations may be used to read data from the associated portion of the semiconductor memory.

In some examples, one or more of the parameters of a trim set may vary over time. For example, voltage and/or charge settings, such as the program voltage and the sense reference voltage may increase over time. The change in trim settings over time may be referred to as trim advancement.

When a first trim set is replaced with a second trim set as part of a trim advancement, every read of the portion of memory associated with the first trim set may result in shifted read or dynamic read. The shifted read or dynamic read may be performed with the settings of the first trim set instead of the second trim set because the portion was programmed with the first trim not the current second trim set. A shifted read or dynamic read may slow down performance of the semiconductor memory. In some examples, trim advancement may impact the data retention margin, so the portions of memory written with the first trim set may start getting errors, thereby slowing down the read.

Data written with the first trim set to a first portion of the memory may be copied to a second portion of the memory, where the data is programmed with the second trim set. However, such copying may increase write amplification, which may decrease the endurance of the memory.

SUMMARY

To address the issues with trim advancement, a system may be provided that adapts to trim set advancement. Trim set advancement may be a change in trim sets over time. The system may include a semiconductor memory, a charge circuit, and a charge adjustment module. The semiconductor memory may include a cell having a first charge level, where the first charge level represents a value, and the cell is programmed to the value with a first trim set. The charge circuit may add a charge to the cell. The charge adjustment module may direct the charge circuit to raise the first charge level of the cell to a second charge level that corresponds to the cell programmed to the value with a second trim set.

A method may be provided to adapt to a change in trim sets over time. A cell of a semiconductor memory may be programmed with a first trim set, the cell having a first charge level. The cell is reprogrammed by raising the first charge level to a second charge level, the second charge level corresponding to the cell programmed with a second trim set.

A memory device may be provided that includes a semiconductor memory, a read module, a charge circuit, and an adaptation module. The semiconductor memory may include word lines. The word lines may include a word line programmed with a first program setting. The programmed word line may be charged to a first charge level representative of a stored value at the first program setting. The read module may read the stored value from the programmed word line. The charge circuit may add a charge to any of the word lines selected for programming. The adaptation module may direct the charge circuit to change the first charge level of the programmed word line to a second charge level, the second charge level representative of the stored value programmed with a second program setting.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

In one example, a system may be provided that adapts to trim set advancement. Trim set advancement may be a change in trim sets over time. The system may include a semiconductor memory, a charge circuit, and a charge adjustment module. The semiconductor memory may include a cell having a first charge level, where the first charge level represents a value, and the cell is programmed to the value with a first trim set. The charge circuit may add a charge to the cell. The charge adjustment module may direct the charge circuit to raise the first charge level of the cell to a second charge level that corresponds to the cell programmed to the value with a second trim set.

Figure 1:
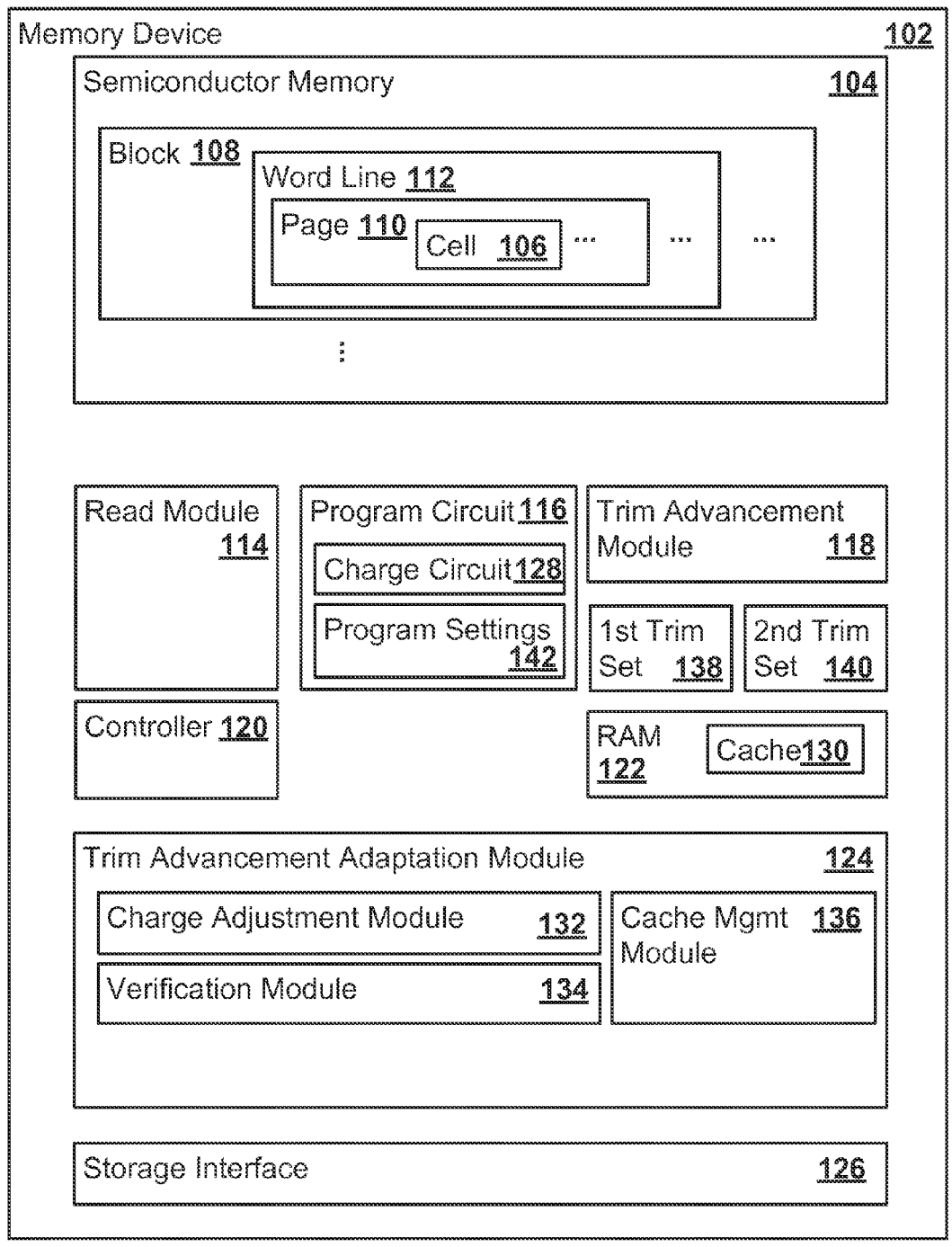
FIG. 1 illustrates a block diagram of a system to adapt to trim advancement.

FIG. 1 illustrates a block diagram of a system 100 to adapt to trim advancement. The system 100 may include a memory device 102 or memory devices. The memory device 102 may be in the form of a flash drive, a solid state storage device, a USB (Universal Serial Bus) drive, an integrated circuit, or any other device that includes semiconductor memory 104.

The semiconductor memory 104 may include one or more memory cells 106. Each of the cells 106 may be a transistor or a combination of semiconductor components that represents a unit of storage in the semiconductor memory 104. The cells 106 in the semiconductor memory 104 may be organized into groups to provide for efficient implementation of read, program and erase functions. For example, the cells 106 may be organized into a group called a unit of erase. The unit of erase may be the smallest number of cells 106 that are erasable at a time. A block 108, for example, may be a unit of erase.

The block 108 may be partitioned into individually addressable pages 110. The page 110 may be a basic unit for reading and/or programming user data. In other words, the page 110 may be a unit of reading and/or a unit of programming.

The cells 106 may be physically arranged in arrays within the semiconductor memory 104 in some examples. Each column of an array may be called a bit line, and each row of the array may be called a word line 112. Each word line 112 may include one or more pages 110 of the cells 106. The cells 106 in each word line 112 may be accessed as a group, and may be activated by a line.

The hierarchical organization of the cells 106 in the semiconductor memory 104 illustrated in FIG. 1 starts at a block level. In other words, the semiconductor memory 104 may include one or more of the blocks 108. Each of the blocks 108 may include one or more of the word lines 112. Each of the word lines 112 may include one or more of the pages 110. Each of the pages 110 may include one or more of the cells 106. The cells 106 may also be organized differently than illustrated in FIG. 1.

In addition to the semiconductor memory 104, the memory device 102 may include a read module 114, a program circuit 116, a trim advancement module 118, a controller 120, a random access memory (RAM) 122, a trim advancement adaptation module (TAAM) 124, and a storage interface 126.

The read module 114 may be any component that reads data from the semiconductor memory 104. In some examples, the read module 114 may include at least a decoder portion (not shown) of error correction code (ECC). ECC may encode user data before the user data is stored in the semiconductor memory 104. The encoded user data is encoded such that a decoder may identify and correct any errors in the user data when the encoded user data is read from the semiconductor memory 104.

The program circuit 116 may be any circuit that stores user data in the semiconductor memory 104. In some examples, the program circuit 116 may be part of, or used by, a write module (not shown) that encodes user data with ECC. The program circuit 116 may store one or more values in a selected portion of the semiconductor memory 104.

The program circuit 116 may include a charge circuit 128. The charge circuit 128 may be any circuit that adds a charge to a selectable portion of the semiconductor memory 104.

The trim advancement module 118 may be any component that adjusts or varies one or more of the parameters of a trim set over time. For example, the trim advancement module 118 may increase a program voltage over time. The trim advancement module 118 may also manage associations of trim sets and corresponding portions of the semiconductor memory 104.

The RAM 122 may be any type of random access memory. The RAM 122 includes a cache 130 for temporarily storing data.

The controller 120 may be any processor configured to translate logical addresses, such as logical block addresses (LBAs), which are received over the storage interface 126, into appropriate signaling to access corresponding portions of the semiconductor memory 104. Examples of the controller 120 include a flash memory controller, a NAND (Negated AND or NOT AND) controller, and a NOR (Not OR) controller.

The storage interface 126 may be any hardware interface for transmitting or receiving user data to or from a host device. The storage interface 126 may be a SCSI (Small Computer System Interface) interconnect, a SATA (Serial Advanced Technology Attachment) interconnect, a USB (Universal Serial Bus) interconnect, a Fibre Channel interconnect, an INFINIBAND® interconnect (INFINIBAND is a registered trademark of System I/O, Inc. of Beaverton, Oreg.), a PATA (IDE) interconnect, or any other hardware interface for communication with a host device.

The trim advancement adaptation module (TAAM) 124 may be a component that adapts to trim advancement by adjusting the charge in one or more of the cells 106 associated with a first trim set 138 that is different than a second trim set 140. The second trim set 140 may be a current trim set determined by the trim advancement module 118. The functionality of the TAAM 124 is described later below. In the example illustrated in FIG. 1, the TAAM 124 includes a charge adjustment module 132, a verification module 134, and a cache management module 136.

The charge adjustment module 132 may be a component that directs the charge circuit 128 to raise the charge in a group of the cells 106 that were programmed with the first trim set 138 so that the cells 106 in the group hold charges consistent with having been programmed with the second trim set 140. The verification module 134 may be a component that determines whether the group of cells 106 affected by the charge adjustment module 132 may be read with settings from the second trim set 140. The cache management module 136 may store user data in the cache 130 so that the charge adjustment module 132 may reprogram the group of the cells 106 based on the cached user data.

During operation of the system 100 to adapt to trim advancement, the program circuit 116 may write user data into the block 108. When programming the block 108 with the user data, the program circuit 116 may use program settings 142. For example, the program settings 142 may include a program voltage or a threshold voltage. Alternatively or in addition, the program settings 142 may include any other setting that controls final charge levels in a unit of programming when the unit of programming is programmed.

The trim advancement module 118 may provide one or more of the program settings 142 to the program circuit 116. For example, if the current trim set is the first trim set 138, then the trim advancement module 118 may provide the program circuit 116 with program related settings of the first trim set 138. If the first trim set 138 includes a threshold voltage, for example, then the program circuit 116 may write the user data into a portion of the block 108 based on the threshold voltage. The portion of the block 108 may be one or more pages 110 of the block 108. Alternatively or in addition, the portion of the block 108 may be one or more word lines 112 or other group of the cells 106 of the block 108.

The trim advancement module 118 may associate the first trim set 138 with the portion of the block 108 that was programmed with the user data because the portion of the block 108 was programmed with one or more parameters of the first trim set 138. The trim advancement module 118 may subsequently change the current trim set from the first trim set 138 to the second trim set 140. Even after the current trim set is changed to the second trim set 140, when the read module 114 reads the user data from the portion of the block 108 programmed with the first trim set 138, the user data may be read based on one or more settings in the first trim set 138. The first trim set 138 is used for the read instead of the second trim set 140 because the portion of the block 108 was programmed with the first trim set 138. This is known as a shifted read or dynamic read. The shifted read may result in a performance penalty that would not have occurred if the portion of the block 108 could have been read based on setting from the current trim set, which is the second trim set 140 in this example.

Figure 2A:
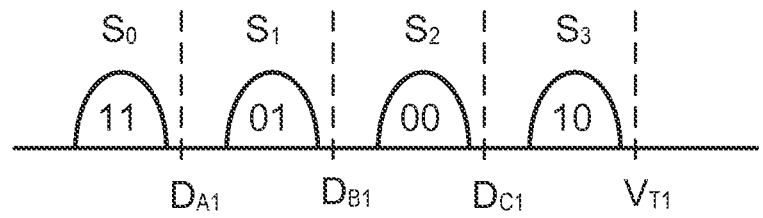
FIG. 2A illustrates four possible states of a multiple level cell of semiconductor memory programmed with a first trim set.

As an example, FIG. 2A illustrates four possible states, designated $S_0$ to $S_3$, of a multiple level cell of the semiconductor memory 104 programmed with the first trim set 138. Each of the four states represents a corresponding two bit value, which ranges from "00" to "11." The first trim set 138 may include a first threshold voltage, $V_{T1}$. Demarcation voltages, $D_{A1}$, $D_{B1}$, and $D_{C1}$, may be determined from the first threshold voltage. Alternatively or in addition, the demarcation voltages may be included in the first trim set 138. The demarcation voltages may partition the voltage range of the cell 106 into the possible states of the cell 106.

Figure 2B:
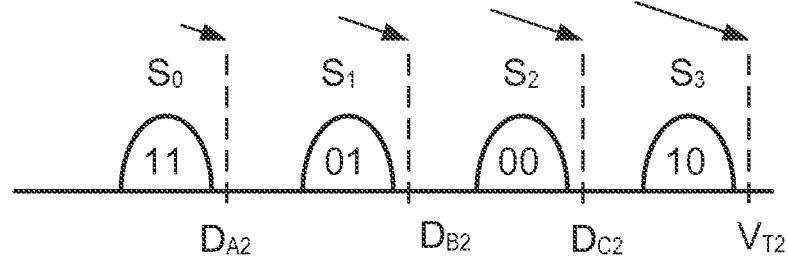
FIG. 2B illustrates four possible states of a multiple level cell programmed with a second trim set.

FIG. 2B illustrates the four possible states of the multiple level cell programmed with the second trim set 140. A second threshold voltage, $V_{T2}$, of the second trim set 140 is higher than the first threshold voltage, $V_{T1}$, of the first trim set 138. Similarly, the demarcation voltages, $D_{A2}$, $D_{B2}$, and $D_{C2}$, of the second trim set 140 are higher than the demarcation voltages, $D_{A1}$, $D_{B1}$, and $D_{C1}$, respectively, of the first trim set 138. If the multiple level cell illustrated in FIGS. 2A and 2B is programmed with the first trim set 138 and read with the second trim set 140, then the programmed state would likely be incorrectly read due to the change in the threshold and demarcation voltages. The shifted read may avoid read errors that result from reading data with a trim set that is different than the trim set used to write the data.

The TAAM 124 may adapt to trim advancement by raising the charge in a group of the cells 106 that were programmed with the first trim set 138 so that the cells 106 in the group hold charges consistent with having been programmed with the second trim set 140, which is the current trim level. As a result, the group of cells 106 may be subsequently read with the second trim set 140 instead of the first trim set 138. The shifted read is no longer needed to read the group of the cells 106, and the performance penalty of a shifted read is avoided after raising the charge.

Figure 2C:
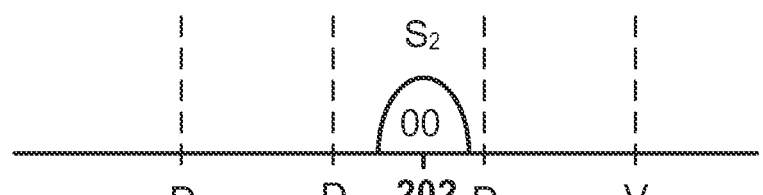
FIG. 2C illustrates a multiple level cell programmed with a first trim set to a first charge level.
Figure 2D:
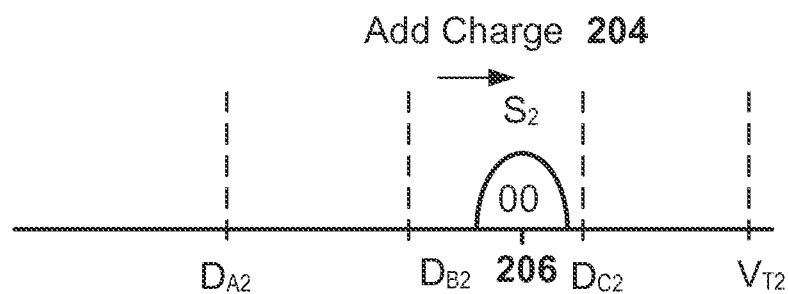
FIG. 2D illustrates a multiple level cell programmed with a second trim set 140 to a second charge level.

FIG. 2C illustrates the multiple level cell programmed with the first trim set 138 to a first charge level 202. The first charge level 202 represents a two bit value "00" and the state $S_2$ in this example. The charge adjustment module 134 may add a charge 204 to the cell so that the cell is at a second charge level 206 that is consistent with the cell having been programmed with the second trim set 140. In other words, the second charge level 206 represents the same state and value under the parameters of the second trim set 140, as the first charge level 202 represents under the parameters of the first trim set 138. FIG. 2D illustrates the multiple level cell programmed with the second trim set 140 to the second charge level 206.

The charge level 202 or 206 may be a voltage, an amount of electrical charge, or any other indication electrical charge. The charge level 202 or 206 of any group of the cells 106 may be a set of voltages, amounts of electrical charges, or any other indications of electrical charges of the cells 106 in the group.

In order to raise the charge in the group of cells 106 that were programmed with the first trim set 138, the cache management module 136 may first read user data from the group of cells 106 with a shifted read. In some examples, ECC may correct errors in the user data as part of reading the user data from the group of the cells 106. The cache management module 136 may store the user data in the cache 130. The charge adjustment module 132 may load the user data from the cache 130 and direct the charge circuit 128 to raise the charge(s) in the group of cells 106 consistent with the loaded user data and the second trim set 140. By adding a charge to the charge that exists in each cell, the user data stored in each cell may not need to be copied to another portion of the semiconductor memory 104. In addition, the group of cells 106 does not necessarily need to be erased.

After the charge adjustment module 132 raises the charge level, the verification module 134 may read the user data from the reprogrammed cells. If no error is detected, then the reprogrammed cells may be considered successfully reprogrammed to the current trim set. Alternatively, if the verification module 134 detects a read error when reading from the reprogrammed cells, then the user data may be copied to a different group of the cells 106 and/or to a different one of the blocks 108. When copied to the new cells 106, the user data may be programmed with the current trim set.

In some examples, the charge adjustment module 132 may raise the charge level by applying just one stage or a subset of the stages in multistage programming. For example, the program circuit 116 may program memory using a foggy-fine programming algorithm if the cell 106 is a triple level cell (×3) or higher. In the first stage of a foggy-fine algorithm, a charge may be added to the cell 106 either at the bottom or the middle of the threshold window depending on the target state. In the next stage, which is the foggy stage, additional charge is added to bring the charge close to the final target state. At the end of the foggy stage, though, the data in the target state is not yet fully resolved into a well-defined distribution of the target state (hence, the "foggy" name) and is not readily extractable. In a final stage, known as a fine program operation, the cell distribution is more accurately resolved to the target range. The target range may be within the demarcation voltages, for example. The charge circuit 128, which is included in the program circuit 116 in some examples, may perform the fine program operation. The charge adjustment module 132 may direct the charge circuit 128 to perform the fine program operation with settings determined from, and/or included in, the second trim set 140. The first two stages of the foggy-fine algorithm may be skipped. Accordingly, the charge adjustment module 132 may raise the charge level faster than if all stages of programming were performed.

Alternatively or in addition, the charge adjustment module 132 may raise the charge level using a test circuit. For example, a test circuit may be able to adjust the charge level in a cell to a target charge level. The charge circuit 128, which may be used by the charge adjustment module 132, may part of such a test circuit.

Alternatively or in addition, the charge circuit 128 may be a circuit used exclusively by the charge adjustment module 132. In some examples, the charge circuit 128 may be included in the charge adjustment module 132.

The TAAM 124 may adapt to trim advancement if an error is encountered performing a shifted read on the group of the cells 106 that were programmed with the first trim set 138. Such errors tend to occur because of charge leaking from the cells 106 over time. If the shifted read is performed with ECC, then the user data may be recovered by the ECC and stored in the cache 130 despite the read error.

In one such example, the TAAM 124 may adapt to trim advancement in response to a read operation received from a host. In another example, the TAAM 124 may adapt to trim advancement in response to a read scrub. A read scrub may be a process in which data is copied from one block to another block so that the ECC used by the memory device 102 may attempt to correct during the copy process any accumulated errors in the block. Some existing read scrub processes are automatically performed at regular intervals, where a block is copied after a predetermined number of read operations. The memory device 102 tracks and stores multiple counters for each of the blocks 108 in order to determine when to perform the read scrub. Instead of copying the data from one block to another, the read scrub process may invoke the TAAM 124 in an attempt to reprogram the cells 106 of the block 108 without copying the user data stored in the cells 106 to other cells 106 of the semiconductor memory 104. Because the TAAM 124 may correct errors with ECC when reading the user data from the block 108, there may be no need to copy the data to another block. Instead, the cells 106 in the block 108 are reprogrammed in place with the current trim set. On the other hand, if the TAAM 124 is unsuccessful in reprogramming the cells 106, then the data in those cells 106 may be copied to another block as is usually done during a read scrub.

Alternatively or in addition, the TAAM 124 may adapt to trim advancement in response to the trim advancement. In other words, in response to the trim advancement module 118 changing the current trim set, the TAAM 124 may operate on the portions of the semiconductor memory 104 that were programmed with any previously selected trim set.

Alternatively or in addition, the TAAM 124 may adapt to trim advancement as part of a block refresh process. The block refresh process may be any process in which charge is added to the cells 106 of the block 108 or a subset of the block 108 to make up for a decay of electrical charge in the cells 106 over time. The TAAM 124 may operate on the portions of the semiconductor memory 104 that were programmed with any previously selected trim set as part of the block refresh process. In addition to making up for the decay of electrical charge, the TAAM 124 may add charge such that the charge in the cells 106 is consistent to having been programmed with the current trim set.

Figure 3:
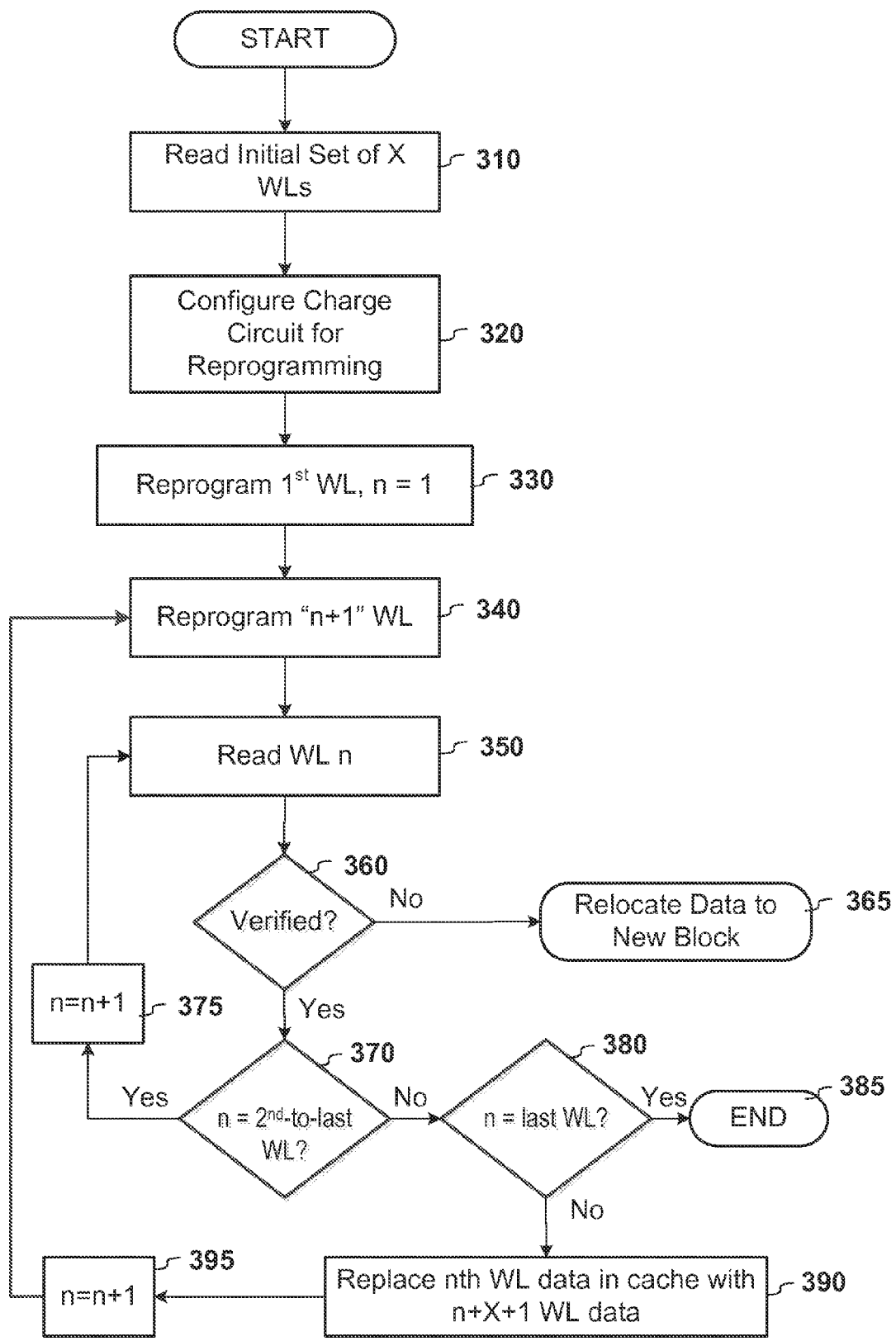
FIG. 3 illustrates a flow diagram of logic of a system to adapt to trim advancement.

FIG. 3 illustrates a flow diagram of logic of the system 100 to adapt to trim advancement. Operations may start, for example, in response to a determination that the block 108 needs to be refreshed during a block refresh process. Alternatively or in addition, the operations may start in response to any other suitable event.

In the example illustrated in FIG. 3, the block 108 may include N word lines. An index n may range from 1 to N and identify any of the word lines 112 in the block 108. User data from all N word lines 112 of the block 108 may be too large to fit in the cache 130 at once. Accordingly, only X word lines are stored in the cache 130 in the example illustrated in FIG. 3.

Operations may start by reading (310) an initial set of X word lines from the block 108. For example, the cache management module 136 may read data from the first X word lines of the block 108 and store the read data in the cache 130.

Next, the charge circuit 128 may be configured (320) for reprogramming. For example, the charge adjustment module 132 may set the program settings 142 for the program circuit 116. The program settings 142 may be settings for the fine program operation. For example, the settings may be to start programming gentler (lower VPGM, SV off, SKIP off, increased loops, and/or other settings suitable for the fine program operation.) As part of configuring the charge circuit 128, the charge adjustment module 132 may set the program settings 142 from the current trim set. Alternatively the trim advancement module 118 may set the program settings 142 from the current trim set independently of the charge adjustment module 132.

Once the charge circuit 128 is configured for reprogramming, the pages of the first word line of the block 108 may be reprogrammed (330). For example, the charge adjustment module 132 may load the pages of the first word line from the cache 130 into the charge circuit 128 and direct the charge circuit 128 to only perform the fine program operation for the first word line. The index n may be set to 1.

Next, the n+1 word line of the block 108 may be reprogrammed (340). For example, the charge adjustment module 132 may load the pages of the n+1 word line from the cache 130 into the charge circuit 128 and direct the charge circuit 128 to only perform the fine program operation for the n+1 word line.

Once the n+1 word line is reprogrammed, the nth word line may be read (350) for verification. For example, the verification module 134 may read the nth word line from the semiconductor memory 104. By reading the nth word line after the n+1 word line is reprogrammed, any effects of reprogramming the n+1 word line on the nth word line may already be present in the nth word line.

The user data read from the nth word line may be verified (360). For example, the verification module 134 may check whether the data read from the nth word line matches the corresponding data previously stored in the cache 130. Alternatively or in addition, the ECC may detect whether an error exists in the user data read from the nth word line. If the data is not verified, then the block 108 may be bad and the operations may end (365). If the block f108 is bad, then operations may end by copying the data in the block 108 to a new block in the semiconductor memory 104.

Alternatively, if the data from the nth word line is verified, then a determination (370) may be made whether n is the second to last word line in the block 108. If n is the second to last word line, then n may be incremented by one (375) and operations may return to the operation (350) in which the nth word line of the block 108 is read.

If n is not the second to last word line of the block 108, then a determination (380) may be made whether n is the last word line in the block 108. If n is the last word line in the block 108, then operations may end (385) by, for example, indicating that the refresh of the block 108 is complete.

Alternatively, if n is not the last word line in the block 108, then the data for the nth word line may be replaced (390) in the cache 130 with data read from the n+X+1 word line if the n+X+1 word line has not already been read into the cache 130. For example, the cache management module 136 may flush the data from the nth word line from the cache 130, and read the n+X+1 word line into the cache 130. The index n may be incremented by one (395), and operations may return to the operation (340) in which the n+1 word line of the block 108 is reprogrammed.

The logic of the system 100 may be performed in a different order than illustrated in FIG. 3. The logic of the system 100 may have additional, different, or fewer operations than illustrated in FIG. 3.

Trim advancement may impact data retention margins. As a result, the blocks written with older trim sets may start getting errors and slow the system down. If the TAAM 124 reprograms the blocks with the current trim set, those errors and performance penalty may be limited.

The system 100 to adapt to trim advancement may be implemented with additional, different, or fewer components than described. Alternatively or in addition, each component may include additional, different, or fewer components than described.

The controller 120 may be in communication with the semiconductor memory 104 and the storage interface 126. The controller 120 may be a microcontroller, a general processor, central processing unit, application specific integrated circuit (ASIC), digital signal processor, field programmable gate array (FPGA), digital circuit, analog circuit, or combinations thereof.

The controller 120 may be one or more devices operable to execute logic. The logic may include computer executable instructions or computer code embodied in firmware, the RAM 122, or in other memory that, when executed by the controller 120, cause the controller to perform features.

The system 100 may be implemented in many different ways. Each module, such as the read module 114, the program circuit 116, the trim advancement module 118, the trim advancement adaptation module 124, the charge adjustment module 132, the verification module 134, and the cache management module 136, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 102, for example, that comprises instructions executable with the controller 120 or other processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the controller 120 or other processor to implement the features of the corresponding module without the module including any other hardware. Because each module includes at least some hardware even when the included hardware comprises software, each module may be interchangeably referred to as a hardware module.

Some of the components may be stored in a computer readable storage medium (for example, as logic implemented as computer executable instructions or as data structures in memory). Parts of the system 100 and its logic and data structures may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL)).

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices may be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

All of the discussion, regardless of the particular implementation described, is exemplary in nature, rather than limiting. For example, although selected aspects, features, or components of the implementations are depicted as being stored in memories, all or part of the system or systems may be stored on, distributed across, or read from other computer readable storage media, for example, secondary storage devices such as hard disks, flash memory drives, floppy disks, and CD-ROMs. Moreover, the various modules and screen display functionality is but one example of such functionality and any other configurations encompassing similar functionality are possible.

The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one embodiment, the instructions are stored on a removable media device for reading by local or remote systems. In other embodiments, the logic or instructions are stored in a remote location for transfer through a computer network or over telephone lines. In yet other embodiments, the logic or instructions are stored within a given computer, central processing unit ("CPU"), graphics processing unit ("GPU"), or system.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components may be resident on separate hardware, such as separate removable circuit boards, or share common hardware, such as a same memory and processor for implementing instructions from the memory. Programs may be parts of a single program, separate programs, or distributed across several memories and processors.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A system for adapting to trim set advancement, wherein trim set advancement is a change in trim sets over time, the system comprising:
a semiconductor memory comprising a cell having a first charge level, the cell raised to the first charge level representing a value when the cell was programmed to the value with a first trim set;
a charge circuit configured to add a charge to the cell; and
a controller configured to direct the charge circuit to raise the first charge level of the cell to a second charge level that corresponds to the cell programmed to the value with a second trim set, the second trim set different than the first trim set.

2. The system of claim 1 wherein the controller is further configured to read a value from the cell with the second trim set after the first charge level is raised to the second charge level and to verify the value read matches the value represented by the first charge level of the cell.

3. The system of claim 1 further comprising a program circuit that includes the charge circuit, wherein the controller is configured to read the value from the cell with the first trim set and to load the value to the program circuit, wherein the charge circuit raises the first charge level of the cell to the second charge level based on the value loaded to the program circuit.

4. The system of claim 1, wherein the charge circuit is configured to raise the first charge level of the cell to the second charge level based on execution of a fine program operation of a foggy fine programming algorithm without execution of any other stages of the foggy fine programming algorithm.

5. The system of claim 1 wherein the controller is further configured to change a current trim set from the first trim set to the second trim set, wherein the controller is configured to direct the charge circuit to raise the first charge level of the cell to the second charge level in response to the change of the current trim set.

6. The system of claim 1 wherein the controller is configured to direct the charge circuit to raise the first charge level of the cell to the second charge level in response to detection of an error in data read from the cell.

7. The system of claim 1 wherein the semiconductor memory includes a three dimensional memory array.

8. A method to adapt to a change in trim sets over time, the method comprising:
programming a cell of a semiconductor memory with a first trim set, the cell having a charge level raised to a first charge level by the programming; and
reprogramming the cell by raising the first charge level to a second charge level, the second charge level corresponding to the cell programmed with a second trim set that is different than the first trim set.

9. The method of claim 8 wherein raising the first charge level to the second charge level is performed as part of a block refresh.

10. The method of claim 8 wherein raising the first charge level to the second charge level is in response to a read scrub.

11. The method of claim 8 wherein raising the first charge level to the second charge level is in response to a trim set advancement.

12. The method of claim 8 further comprising reprogramming a page, which was programmed with the first trim set, by performing a fine program operation on the page without erasing the page.

13. The method of claim 8 further comprising reading data from the cell programmed with the first trim set, wherein raising the first charge level to the second charge level comprises writing the data to the cell with parameters from the second trim set.

14. A memory device comprising:
a semiconductor memory comprising a plurality of word lines, the word lines including a word line programmed with a first program setting, the programmed word line charged to a first charge level representative of a stored value at the first program setting;
a controller configured to read the stored value from the programmed word line; and
a charge circuit configured to add a charge to any of the word lines selected for programming,
wherein the controller is further configured to direct the charge circuit to change the first charge level of the programmed word line to a second charge level, the second charge level representative of the stored value programmed with a second program setting, the second program setting different than the first program setting.

15. The memory device of claim 14, wherein the controller is further configured to verify a value read from the programmed word line with the second program setting after the first charge level is changed to the second charge level.

16. The memory device of claim 14, wherein the controller is further configured to cache the stored value read by the read module, wherein the charge circuit changes the first charge level to the second charge level based on the cached stored value.

17. The memory device of claim 14 further comprising a program circuit configured to program any of the word lines, wherein the charge circuit is included in the program circuit, and wherein the charge circuit is configured to changes the first charge level of the programmed word line to the second charge level based on execution of a fine program operation of a foggy fine programming algorithm without other stages of the foggy fine programming algorithm.

18. The memory device of claim 14 further comprising a test circuit that includes the charge circuit, wherein the test circuit is configured to adjust any charge level in any of the word lines to a target charge level.

19. The memory device of claim 14, wherein the controller is configured to direct the charge circuit to change a respective charge level of each word line in a block to a corresponding second charge level, the corresponding second charge level consistent with each word line in the block having been programmed with the second program setting.

20. The memory device of claim 14, wherein the adaptation module is configured to direct the charge circuit to change the first charge level of the programmed word line to the second charge level as part of a block refresh in which charge lost to charge decay over time is restored to the programmed word line.

21. A memory device comprising:
- a semiconductor memory comprising a plurality of word lines, the word lines including a word line programmed with a first program setting, the programmed word line charged to a first charge level representative of a stored value at the first program setting;
- a means for reading the stored value from the programmed word line; and
- a means for raising the first charge level of the programmed word line to a second charge level, the second charge level representative of the stored value programmed with a second program setting, the second program setting different than the first program setting.

* * * * *